United States Patent [19]

Fister et al.

[11] Patent Number: 4,632,898
[45] Date of Patent: Dec. 30, 1986

[54] PROCESS FOR FABRICATING GLASS TOOLING

[75] Inventors: Robert V. Fister, Hilton; James R. Pledger, Rochester, both of N.Y.

[73] Assignee: Eastman Kodak Company, Rochester, N.Y.

[21] Appl. No.: 723,411

[22] Filed: Apr. 15, 1985

[51] Int. Cl.⁴ .............................................. G03C 5/00
[52] U.S. Cl. .................................... 430/313; 430/323; 430/331; 430/495; 430/942; 156/643; 156/646; 156/652; 156/659.1
[58] Field of Search ............... 430/323, 331, 313, 495, 430/942; 156/643, 646, 652, 659.1, 642

[56] References Cited

U.S. PATENT DOCUMENTS

| 3,600,243 | 8/1971 | LaRocque et al. | 156/3 |
| 3,794,536 | 2/1974 | Muska | 156/11 |
| 3,957,609 | 5/1976 | Sasano et al. | 204/192 |
| 4,275,091 | 6/1981 | Lippits et al. | 427/53.1 |
| 4,374,077 | 2/1983 | Kerfeld | 264/22 |
| 4,421,593 | 12/1983 | Curtis et al. | 156/643 |
| 4,444,869 | 4/1984 | Chonan et al. | 430/325 |
| 4,556,628 | 12/1985 | Greschner et al. | 430/314 |

FOREIGN PATENT DOCUMENTS

| 00126594 | 11/1984 | European Pat. Off. |
| 54-138405 | 10/1979 | Japan |
| 59-033645 | 2/1984 | Japan |
| 02445348 | 5/1975 | Fed. Rep. of Germany |

OTHER PUBLICATIONS

*IBM Technical Disclosure Bulletin,* vol. 13, No. 2, Jul. 1970, p. 394, P. P. Castrucci et al., "Chrome Mask Fabrication by RF Sputter Etch".
*Review of the Electrical Communication Laboratories,* vol. 32, No. 2, "Properties of Injection–Molded Plastic Substrates for Laser Beam Memory".

*Primary Examiner*—John E. Kittle
*Assistant Examiner*—Patrick J. Ryan
*Attorney, Agent, or Firm*—William C. Dixon

[57] ABSTRACT

The present disclosure relates to a process for fabricating glass tooling with a featured surface. The method entails the steps of coating a polished surface of a glass blank with a continuous metal coating. A photoresist is applied, exposed, and developed in a desired pattern. Uncovered metal is etched away and the remaining metal provides a mask. The uncovered glass is plasma etched to feature the surface of the glass blank.

8 Claims, 20 Drawing Figures

PROCESS FOR FABRICATING GLASS TOOLING

BACKGROUND OF THE INVENTION

1. Field of the Invention

The present invention relates generally to a process for fabricating glass tooling such as molds with featured surfaces.

2. Description of the Prior Art

A typical process for making featured-surface tooling is shown in FIGS. 1a to 1g. A polished glass blank 22, FIG. 1a, is coated with a layer of photoresist 24, FIG. 1b. A latent image is written onto the photoresist layer by means of modulated laser light focused by an optical system 26 (FIG. 1c) so that it is registered in the form of a pattern of voids in the developed photoresist layer (FIG. 1d). After application of a release layer, a thin nickel layer 28 (FIG. 1e) is electrochemically deposited onto the patterned side of the glass blank and is then removed to form a single metal negative copy of the vulnerable master which is destroyed in the process, this copy being referred to in the industry as the "father." Electrochemical copying of the father produces a limited number (six or so) of "mother" copies 30 (FIG. 1f) before the father has deteriorated to the point that the resolution of additional mothers would be unsatisfactory. The mothers are positive copies of the master, and are themselves copied a limited number of times to produce negative "son" copies 32, as shown in FIG. 1g. The sons are used as tooling having a featured surface. This "family" process is necessary so that many production tools may be made from a single glass master mold. However, each generation of the family, and each succeeding member of the same generation, suffers increasing resolution degradation.

SUMMARY OF THE INVENTION

The present invention relates to a process for fabricating glass tooling with a featured surface. The method entails the steps of coating a polished surface of a glass blank with a continuous metal coating. A photoresist is applied, exposed, and developed in a desired pattern. Uncovered metal is etched away and the remaining metal provides a mask. The uncovered glass is plasma etched to feature the surface of the glass blank.

The invention, and its objects and advantages, will become more apparent in the detailed description of the preferred embodiment presented below.

BRIEF DESCRIPTION OF THE DRAWINGS

The description of preferred embodiments refers to the attached drawings wherein.

DETAILED DESCRIPTION OF THE PREFERRED EMBODIMENTS

Figure 1A:
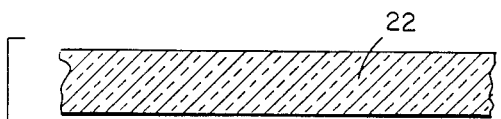
FIGS. 1a to 1g are a series of sectional fragmental views of a prior art manufacturing process for molds.
Figure 1B:
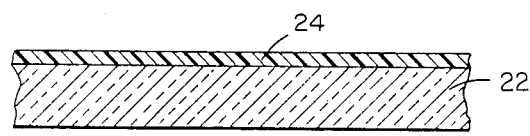
Figure 1C:
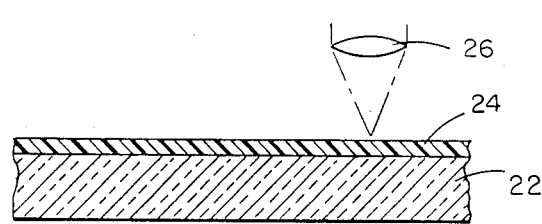
Figure 1D:
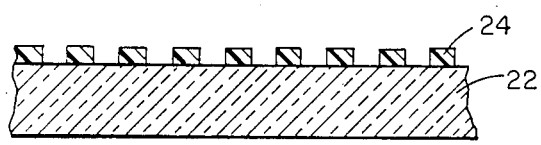
Figure 1E:
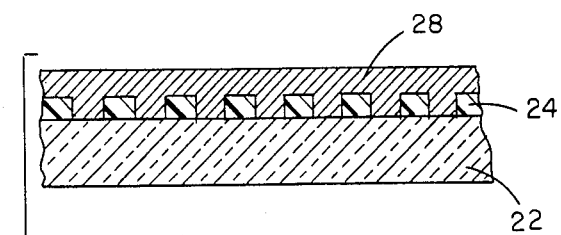
Figure 1F:
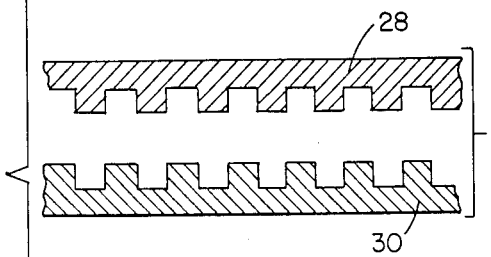
Figure 1G:
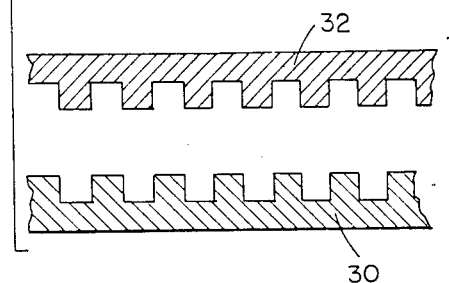
Figure 2A:
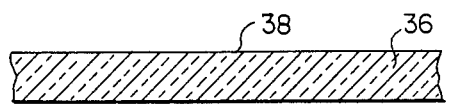
FIGS. 2a to 2h are a series of sectional fragmental views of a manufacturing process for tools in accordance with the present invention.

The manufacturing method described in this specification presents a process for making clear glass tooling from a polished, flat glass plate. FIGS. 2a to 2h schematically show a preferred manufacturing process for the tooling. FIG. 2a illustrates a glass blank 36 which has been selected for its light transmission properties, absence of internal voids, and polishability. One surface 38 of blank 36 has been ground and polished, preferably to a finish with defects no larger than about 10 Å to 15 Å RMS and scratches of widths less than one micro inch.

Figure 2B:
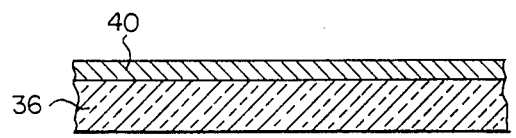
Figure 2C:
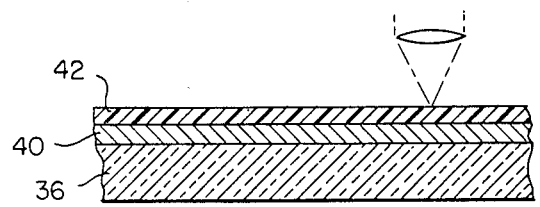

Referring to FIG. 2b, a thin layer 40 of metal (preferably chrome) has been deposited on polished surface 38. Preferably the chrome layer is from 800 Å to 1000 Å RMS thick and may be deposited by standard vacuum coating techniques. Other coating methods will readily occur to those skilled in the art. A positive working photoresist layer 42, such as Eastman Kodak Company resist KPR-820, is applied to the chrome layer such as by spin coating. The photoresist is dried and post-baked in accordance with usual application techniques. As shown in FIG. 2c, latent images are formed in the photoresist layer by focused light, i.e. laser light. The latent image contains the pattern which is to be etched into glass blank 36.

Figure 2D:
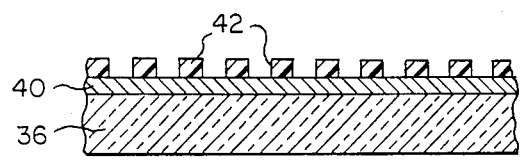
Figure 2E:
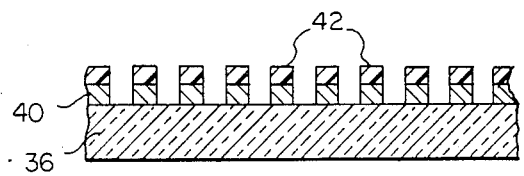
Figure 2F:
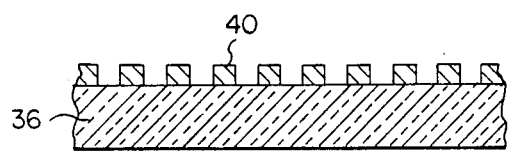

Various chemicals well known in the art are usable to develop resist 42 as shown in FIG. 2d. After the resist is developed, the portion of chrome layer 40 not protected by resist is etched down to glass blank 36 (FIG. 2e). FIG. 2f shows the glass and chrome pattern following removal of unexposed photoresist by a suitable solvent.

Figure 2G:
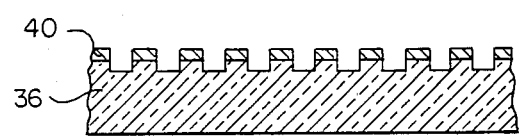
Figure 2H:
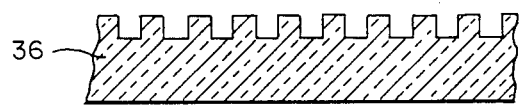

The glass blank with the chrome pattern (FIG. 2f) is placed in a vacuum coater. A plasma is established using argon gas at approximately $1.2 \times 10^{-3}$ torr. Radio frequency power is applied to the gas at 500 watts and 400–500 volts. Chromium is a sacrificial mask for plasma etching glass, and the plasma erodes away the glass and the chrome mask. Pattern depth is controlled by the thickness of the mask, the power, and the duration of etch. Depths of approximately 1000 Å RMS can be obtained with an etch time of one hour and a chromium thickness of 800 Å RMS. The rate at which the chromium erodes is about $\frac{1}{3}$ to $\frac{1}{2}$ slower than the glass. FIG. 2g shows the etched glass blank and chrome coating. FIG. 2h shows the glass after chrome removal by a conventional acid. After the chrome has been removed, the master is optically clear and can transmit ultraviolet light.

Glass tooling made in accordance with the present invention may be used in a molding process for making optical disks as shown in FIGS. 3a to 3e. A rigid metal substrate 44 (FIG. 3a) is aligned with and spaced from featured glass tooling 46 which has been prepared in accordance with the process illustrated in FIGS. 2a to 2h. The gap between substrate 44 and tooling 46 is filled with a liquid molding resin 48 (FIG. 3b) which is radiation polymerizable.

Figure 3A:
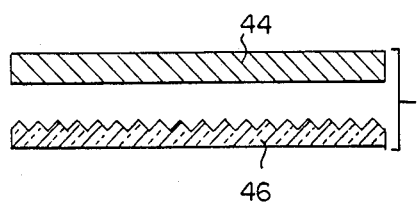
FIGS. 3a to 3e are a series of sectional fragmental views of a manufacturing process for using tooling made in accordance with the present invention.
Figure 3B:
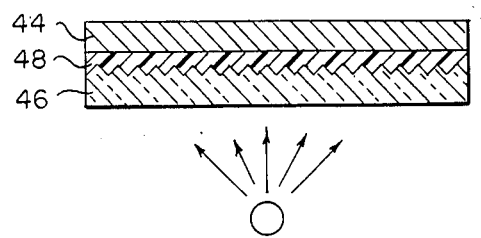

As shown in FIG. 3b, the resin is polymerized by ultraviolet light through transparent tooling 46. The light source may be a mercury-vapor lamp having a wave length of about 330 nm to 450 nm. If featured, the resultant sub-layer has a resolution in the order of 0.05 micro inch, and shrinkage is less than two percent.

Figure 3C:
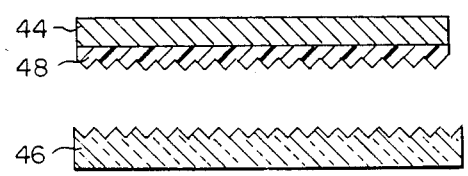
Figure 3D:
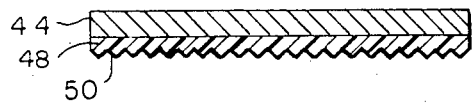
Figure 3E:
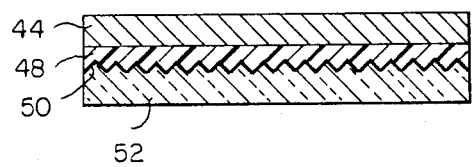

The polymerized resin 48 adheres to the substrate 44 but not to the glass tooling 46, which can be parted from the resin as shown in FIG. 3c. The featured surface of the resin can be coated with various layers such as a metal mirror or record layer 50 (FIG. 3d) and a protective transparent layer 52 (FIG. 3e).

The invention has been described in detail with particular reference to certain preferred embodiments thereof, but it will be understood that variations and modifications can be effected within the spirit and scope of the invention.

We claim:

1. A process for fabricating glass tooling with a featured surface, said process comprising the steps of:
    coating a polished surface of a glass blank with a continuous metal coating;
    applying a photoresist layer to the metal coating;
    exposing the photoresist layer so as to create therein a desired pattern latent image;
    developing the latent image, leaving certain portions of the metal coating uncovered and other portions thereof still covered by remaining portions of the photoresist layer;
    etching away said uncovered portions of the metal coating, leaving corresponding portions of the glass blank uncovered and other portions thereof covered by a mask including said other portions of the metal coating still covered by said remaining portions of the photoresist layer;
    removing said remaining portions of the photoresist layer from said other portions of the metal coating;
    plasma etching into said uncovered portions of the glass blank while said other portions thereof are covered by said other portions of the metal coating; and
    removing said other portions of the metal coating from said other portions of the glass blank;
    thereby leaving the glass blank etched in accordance with said desired pattern and clear of said mask, to provide said glass tooling with said featured surface for use as a durable master in a subsequent molding process.

2. The process set forth in claim 1 wherein the metal coating comprises chrome.

3. The process set forth in claim 1 wherein the metal coating is vacuum coated, and is about 800 Å to 1000 Å thick.

4. The process set forth in claim 3 wherein the metal coating comprises chrome.

5. The process set forth in claim 1 wherein the plasma etching is done with argon gas.

6. The process set forth in claim 5 wherein the metal coating comprises chrome.

7. The process set forth in claim 1 wherein the photoresist layer comprises a positive working material applied by spin coating.

8. The process set forth in claim 1 wherein the exposing is done by focused laser light.

* * * * *